United States Patent
Tang et al.

(10) Patent No.: US 9,973,084 B2
(45) Date of Patent: May 15, 2018

(54) SWITCHING VOLTAGE REGULATOR INPUT POWER ESTIMATION

(71) Applicant: Infineon Technologies Austria AG, Villach (AT)

(72) Inventors: Benjamim Tang, Rancho Palos Verdes, CA (US); Darryl Tschirhart, Torrance, CA (US); Tim Ng, Monterey Park, CA (US)

(73) Assignee: Infineon Technologies Austria AG, Villach (AT)

( * ) Notice: Subject to any disclaimer, the term of this patent is extended or adjusted under 35 U.S.C. 154(b) by 546 days.

(21) Appl. No.: 14/548,967

(22) Filed: Nov. 20, 2014

(65) Prior Publication Data

US 2016/0149489 A1    May 26, 2016

(51) Int. Cl.
| | |
|---|---|
| *H02M 3/158* | (2006.01) |
| *G01R 21/06* | (2006.01) |
| *G01R 21/133* | (2006.01) |
| *H02M 1/32* | (2007.01) |
| *H02M 1/00* | (2006.01) |

(52) U.S. Cl.
CPC ............ *H02M 3/158* (2013.01); *G01R 21/06* (2013.01); *G01R 21/133* (2013.01); *H02M 3/1584* (2013.01); *H02M 1/32* (2013.01); *H02M 2001/0048* (2013.01); *Y02B 70/1491* (2013.01)

(58) Field of Classification Search
None
See application file for complete search history.

(56) References Cited

U.S. PATENT DOCUMENTS

| | | | |
|---|---|---|---|
| 4,027,227 | A | 5/1977 | Engel et al. |
| 4,278,930 | A | 7/1981 | Rogers |
| 4,309,650 | A | 1/1982 | Boros et al. |
| 4,811,184 | A | 3/1989 | Koninsky et al. |
| 5,889,387 | A | 3/1999 | Massie |
| 5,900,714 | A | 5/1999 | Dubhashi et al. |
| 6,184,660 | B1 | 2/2001 | Hartular et al. |
| 6,294,904 | B1 | 9/2001 | Hirst |
| 6,424,129 | B1 | 7/2002 | Lethellier |
| 7,629,787 | B2 | 12/2009 | Lu |
| 8,120,336 | B2 | 2/2012 | Mehas et al. |
| 8,710,810 | B1 | 4/2014 | McJimsey et al. |

(Continued)

FOREIGN PATENT DOCUMENTS

| | | |
|---|---|---|
| CN | 101988943 A | 3/2011 |
| CN | 102263505 A | 11/2011 |

(Continued)

OTHER PUBLICATIONS

Pyakuryal et. al, Filter Design for AC to DC Converter, International Refereed Journal of Engineering and Science (IRJES), vol. 2, Issue 6 (Jun. 2013), pp. 42-49.*

*Primary Examiner* — Andres Munoz
(74) *Attorney, Agent, or Firm* — Murphy, Bilak & Homiller, PLLC (57) ABSTRACT

An estimate of voltage regulator input power is provide by estimating output power of the voltage regulator based on output voltage and output current of the voltage regulator, estimating power loss of the voltage regulator and estimating input power of the voltage regulator based on the estimated output power and the estimated power loss.

11 Claims, 5 Drawing Sheets

(56) References Cited

U.S. PATENT DOCUMENTS

| | | | |
|---|---|---|---|
| 2005/0168198 A1* | 8/2005 | Maksimovic | H02M 1/4225 323/222 |
| 2005/0219872 A1* | 10/2005 | Lys | F21S 48/325 363/21.04 |
| 2006/0001408 A1 | 1/2006 | Southwell et al. | |
| 2006/0267687 A1 | 11/2006 | Gammie et al. | |
| 2007/0013350 A1 | 1/2007 | Tang et al. | |
| 2007/0046281 A1* | 3/2007 | Domingo | G01R 21/133 324/142 |
| 2007/0241763 A1 | 10/2007 | Panhofer | |
| 2009/0201086 A1 | 8/2009 | Kindt et al. | |
| 2009/0261795 A1 | 10/2009 | Tang et al. | |
| 2009/0306914 A1* | 12/2009 | Cohen | G01R 21/06 702/60 |
| 2010/0052611 A1 | 3/2010 | Lyle, Jr. | |
| 2010/0231187 A1 | 9/2010 | Wicht et al. | |
| 2012/0062240 A1 | 3/2012 | Nishijima et al. | |
| 2012/0101750 A1* | 4/2012 | Chen | G01R 31/40 702/60 |
| 2012/0194258 A1 | 8/2012 | Nien et al. | |
| 2012/0281433 A1* | 11/2012 | Yamanaka | H02M 7/003 363/13 |
| 2013/0135047 A1 | 5/2013 | Danioni et al. | |
| 2013/0193879 A1 | 8/2013 | Sadwick et al. | |
| 2013/0194839 A1* | 8/2013 | Barbati | H02M 1/12 363/44 |
| 2014/0052394 A1 | 2/2014 | Sun | |
| 2014/0077741 A1 | 3/2014 | Kumagai et al. | |
| 2014/0159734 A1 | 6/2014 | Knill et al. | |
| 2014/0312818 A1 | 10/2014 | Furuchi | |
| 2014/0354303 A1 | 12/2014 | Harrison | |
| 2014/0376279 A1 | 12/2014 | Park | |
| 2015/0015160 A1 | 1/2015 | Angelin et al. | |
| 2015/0089253 A1 | 3/2015 | Doering et al. | |
| 2015/0146328 A1 | 5/2015 | Mikami et al. | |
| 2015/0346758 A1 | 12/2015 | Sakakibara | |
| 2016/0268899 A1 | 9/2016 | Rader et al. | |

FOREIGN PATENT DOCUMENTS

| | | | |
|---|---|---|---|
| CN | 203445784 U | 2/2014 | |
| GB | 2470214 A * | 11/2010 | H02M 3/156 |
| JP | 2002051540 A | 2/2002 | |
| JP | 2013038251 A | 2/2013 | |
| TW | 200909822 A | 3/2009 | |

* cited by examiner

SWITCHING VOLTAGE REGULATOR INPUT POWER ESTIMATION

TECHNICAL FIELD

The present application relates to switching voltage regulators, in particular estimating input power of switching voltage regulators.

BACKGROUND

In many electrical systems a load is connected to a source through a switching power converter. It is advantageous to know how the actions of the load affect the power strain on the incoming source. For example, knowledge of the regulator input power is typically used for telemetry purposes, fault monitoring and system optimization. The power required from the source equals that consumed by the load plus losses within the switching power converter. If there is no loss between the source and the power converter, the power demanded from the source equals the input power to the converter. Input voltage to a converter is an existing measurement required for protection and possibly control of the converter. Then, only input current must be known to obtain the input power of the power converter. Obtaining the input current value is considerably more involved than voltage measurement if accuracy is to be maintained without adversely affecting efficiency. In addition, obtaining the input current generally requires the addition of a series element such as a sense resistor in order to obtain a measurement of the current through the series element.

Input power is the product of input voltage and input current. Input voltage is an existing telemetry value required for power supply protection and control. Input current is measured or estimated. In the case of measurement, external components are required on the board, increasing cost and board area consumed. In terms of estimation, the input current estimate relies heavily on the accuracy of the sensed input voltage. The input voltage rail is typically noisy which leads to incorrect current estimation and incorrect input voltage reporting. A combination of erroneous current and voltage estimates results in erroneous input power reporting. Hence, a more accurate switching voltage regulator input power estimation technique is desirable.

SUMMARY

According to an embodiment of a method of estimating input power of a voltage regulator, the method comprises: estimating output power of the voltage regulator based on output voltage and output current of the voltage regulator; estimating power loss of the voltage regulator; and estimating input power of the voltage regulator based on the estimated output power and the estimated power loss.

According to an embodiment of a voltage regulator, the voltage regulator comprises a power stage and a controller. The power stage is configured to deliver output current to a load through an inductor. The controller is operable to estimate output power of the voltage regulator based on output voltage and output current of the voltage regulator, estimate power loss of the voltage regulator and estimate input power of the voltage regulator based on the estimated output power and the estimated power loss.

According to another embodiment of a voltage regulator controller, the voltage regulator comprises an input power estimator operable to: estimate output power of the voltage regulator based on output voltage and output current of the voltage regulator; estimate power loss of the voltage regulator; and estimate input power of the voltage regulator based on the estimated output power and the estimated power loss.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide for estimating input power of a switching voltage regulator without measuring the regulator input current. As a result, no additional components are required for estimating the voltage regulator input power. In addition, the input power estimate has a small dependence on input voltage. Switching power converters are required to know their output voltage and current with a high degree of accuracy for control and protection requirements. Using these known quantities and information indicating how hard the converter is working to maintain regulation, an estimate of how much power is being consumed by the system can be determined. That is, losses and input power are estimated based on the output power and control effort of the regulator. In one case, input voltage sensing is used but the potential downfalls can be mitigated by having a loose reliance on its accuracy. In other cases, input power and loss estimates are not based on input voltage sensing.

Figure 1:
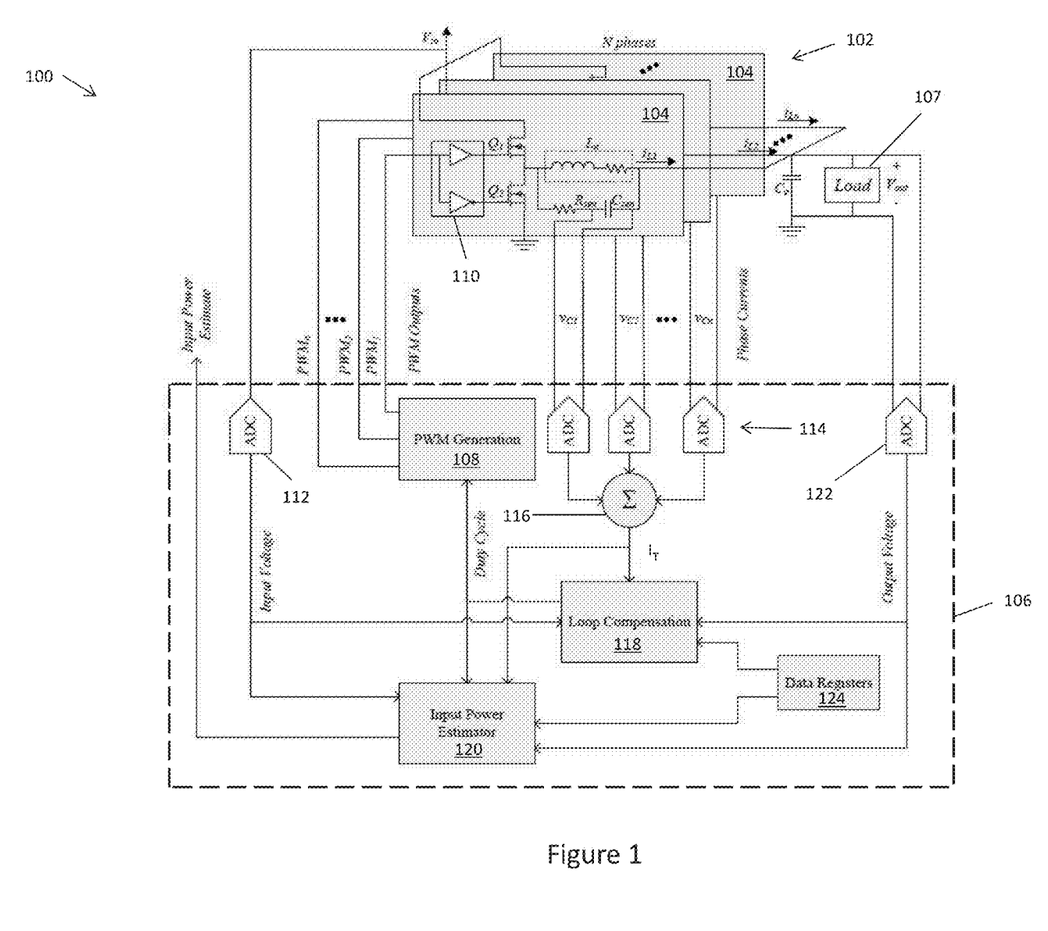
FIG. 1 illustrates a block diagram of an embodiment of a multiphase switching voltage regulator having an input power estimator.

FIG. 1 illustrates an embodiment of a switching voltage regulator 100 comprising a power stage 102 including a plurality of phases 104 and a controller 106 such as a microcontroller, microprocessor, ASIC (application-specific integrated-circuit), etc. for controlling operation of the power stage 102. Each phase 104 is operable to deliver a phase current ($I_{Ln}$) through a separate inductor ($L_O$) to a load 107. The load 107 is connected to the switching voltage regulator 100 via the inductors and an output capacitor ($C_O$). The load 107 can be a high-performance integrated circuit such as a microprocessor, graphics processor, network processor, etc. or other type of integrated circuit requiring voltage regulation such as a POL (point-of-load).

Each phase 104 has a high-side transistor (Q1) and a low-side transistor (Q2) for coupling to the load 107 through the corresponding inductor. The high-side transistor of each phase 104 switchably connects the load 107 to an input voltage (Vin) of the switching voltage regulator 100, and the corresponding low-side transistor switchably connects the load 107 to ground at different periods. N phases are shown in FIG. 1. The power stage 102 can include any desired number of phases including one phase (single-phase implementation) or more than one phase (multi-phase implementation).

The controller 106 regulates the voltage ($V_{out}$) delivered to the load 107 by the power stage 102, by adjusting the phase currents delivered to the load 107. The controller 106 can include a pulse width modulator (PWM) 108 for switching each phase 104 of the power stage 102 via a corresponding PWM control signal (PWM1, PWM2, . . . , PWMn) so that the power stage 102 sources or sinks current to the load 107 through the corresponding inductor and the high-side or low-side transistor. When the PWM control signal is at a logic level high, the high-side transistor is placed in a conductive state, the inductor current is sourced or sunk through the high-side transistor, and the current through the inductor increases for the duration. This is generally referred to as the 'on-time' and the power stage 102 is considered to be 'turned on'. When the PWM control signal is at a logic level low, the low-side transistor is placed in a conductive state, current is sourced or sunk from the low-side transistor, and the current through the inductor decreases for the duration. This is generally referred to as the 'off-time' and the power stage 102 is considered to be 'turned off'. When the PWM control signal is at a trivalent or high impedance logic level (the PWM control signal is neither high nor low), both the high-side and the low-side transistors are placed in a non-conductive state, current is sourced or sunk through either the low-side or high side transistor body diodes, and the magnitude of the current through the inductor decreases towards zero. This is generally referred to as the 'HiZ-time' or 'inactive time' and the power stage 102 is considered to be in 'High Z' or inactive.

In DCM (discontinuous conduction mode), the low-side transistor is not allowed to be conductive when the inductor current reaches zero. The cycle then consists of an on-time, followed by an off-time, followed by a HiZ time. During the HiZ time, the inductor current approaches zero and does not change for the duration of the cycle once it is zero. As a result, the inductor current does reach zero during part of the switching cycle in DCM. In CCM (continuous conduction mode), the inductor current does not stop at zero between switching cycles. That is in DCM, the inductor current is always positive or zero and in CCM the inductor current can be positive or negative but does not stay at zero. The inductor current can cross zero and go negative e.g. at no-load, and the voltage regulator 100 can operate in CCM where the triangular inductor current is centered at zero.

In either CCM or DCM, drivers 110 of the power stage 102 provide gate drive signals to the gates of the high-side and low-side transistors of the corresponding phases 104 in response to the PWM control signals provided by the controller 106. The activation state of the phases 104 and the duty cycle of the high-side and low-side transistors are determined at least in part based on the output voltage ($V_{out}$) applied to the load 107 so that the switching voltage regulator 100 can react as quickly and reliably as possible to changing load conditions.

The controller 106 can manage changes from one reference voltage to another. The controller 106 can also determine errors between the output voltage ($V_{out}$) and a reference voltage, and convert the error voltage into a digital representation provided to the PWM 108 for modifying the switching cycle of the phases 104 e.g. by adjusting the duty cycle. Such voltage regulation functions are standard in typical digitally-controlled switching voltage regulators, and therefore no further explanation is given in this regard.

In addition to regulating the voltage delivered to the load 107, the controller 106 estimates the input power ($P_{in}$) of the switching voltage regulator 100 without measuring the regulator input current. In one embodiment, the controller 106 further includes input voltage ADC (analog-to-digital conversion) sense circuitry 112 for measuring the input voltage ($V_{in}$) to the power stage 102. The controller 106 also monitors the phase currents delivered by the phases 104 to the load 107 e.g. by measuring the phase currents ($I_{Ln}$) injected into the corresponding inductors by DCR sensing. The controller 106 estimates the total current ($I_{out}$) delivered to the load 107 by the switching voltage regulator 100 based on the phase currents measured by DCR sensing. The controller 106 can estimate the input power ($P_{in}$) of the switching voltage regulator 100 based on the measured input voltage and measured output current. The controller 106 can measure the regulator output current using any standard current sense circuitry.

For example in the embodiment shown in FIG. 1, the power stage 102 of the switching voltage regulator 100 includes an RC current sense network coupled in parallel with each phase 104. The RC current sense network includes a resistor ($R_{sen}$) connected in series with a capacitor ($C_{sen}$). The RC current sense network accounts for the DCR (non-ideal DC resistance) of the corresponding inductor. The voltage ($V_{Cn}$) measured across the capacitor $C_{sen}$ represents the voltage across the DCR of that inductor, meaning the current ($I_{Ln}$) through the inductor is related to the ratio of the capacitor voltage to DCR value. The controller 106 includes current sense ADC circuitry 114 for generating an estimate of the current through each inductor based on the voltage ($V_{C1}$, $V_{C2}$, . . . , $V_{Cn}$) measured across the capacitors of the respective RC current sense networks. In one embodiment, the controller 106 is a digital controller and the current sense ADC circuitry 114 converts the individual voltages ($V_{C1}$, $V_{C2}$, . . . , $V_{Cn}$) measured by the DCR sense networks 112 to a corresponding digital value. The digitized values output by the current sense ADC circuitry 114 represent the individual phase current estimates, which are summed 116 to provide a digitized total current estimate ($I_T$). In the case of a single-phase switching voltage regulator, the regulator includes only one output inductor (L) and the summing stage 116 can be omitted. In this case, the digitized total current estimate $I_T$ shown in FIG. 1 is the current estimate determined for the single inductor.

Figure 2:
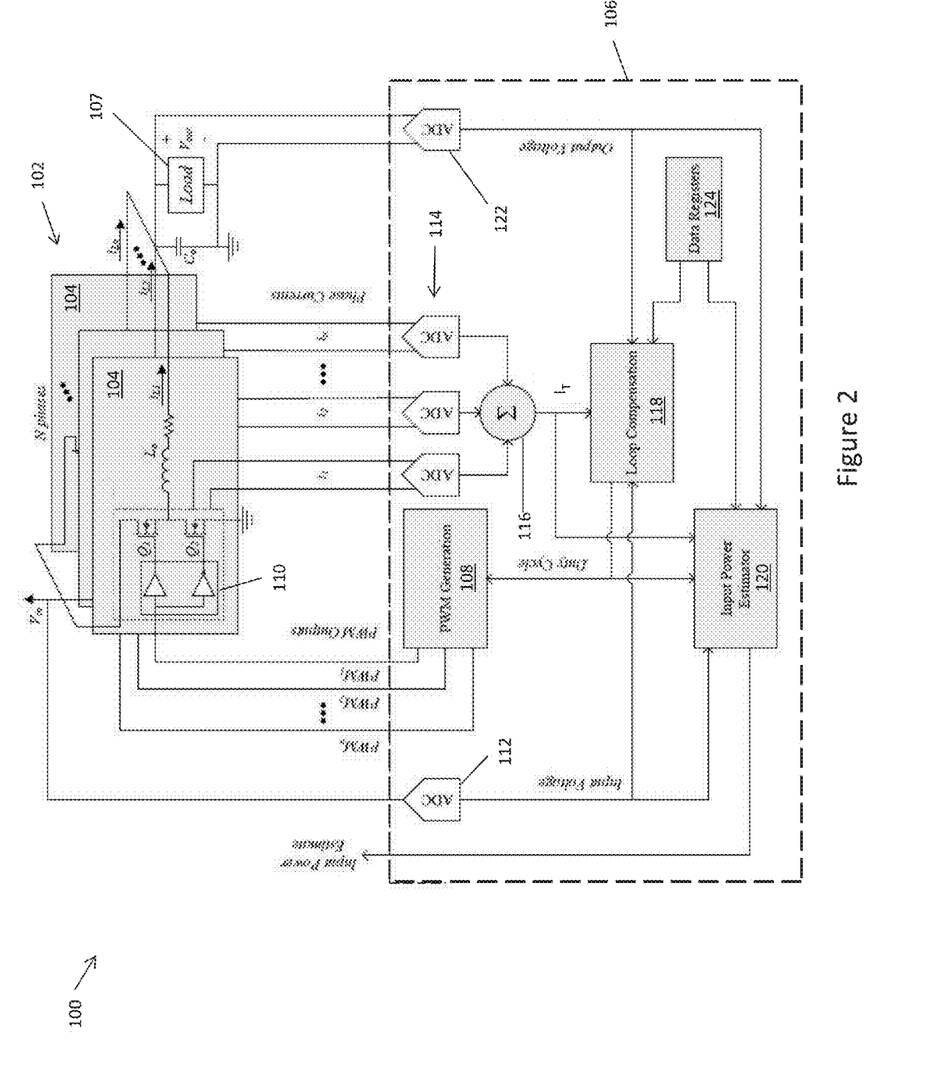
FIG. 2 illustrates a block diagram of another embodiment of a multiphase switching voltage regulator having an input power estimator.

FIG. 2 illustrates another embodiment of the switching voltage regulator 100. The embodiment shown in FIG. 2 is similar to the embodiment shown in FIG. 1. Different however, the current sense ADC circuitry 114 of the controller 106 is implemented as an integrated current sensor where the current sense circuitry 114 senses the current through the respective inductors. The integrated current sense signals are shown as currents ($i_1$, $i_2$, . . . , $i_n$) in FIG. 2, but they could be voltages instead.

In both embodiments of FIGS. 1 and 2, the controller 106 includes a loop compensation filter 118. The loop compensation filter 118 is programmed to satisfy gain and phase margin targets for the voltage regulator controller 106, as a function of a plurality of system parameters for the controller 106. For example, the loop compensation filter 118 can be programmed to maintain the overall output impedance response of the switching voltage regulator 100 as smooth (flat) as possible.

Figure 3:
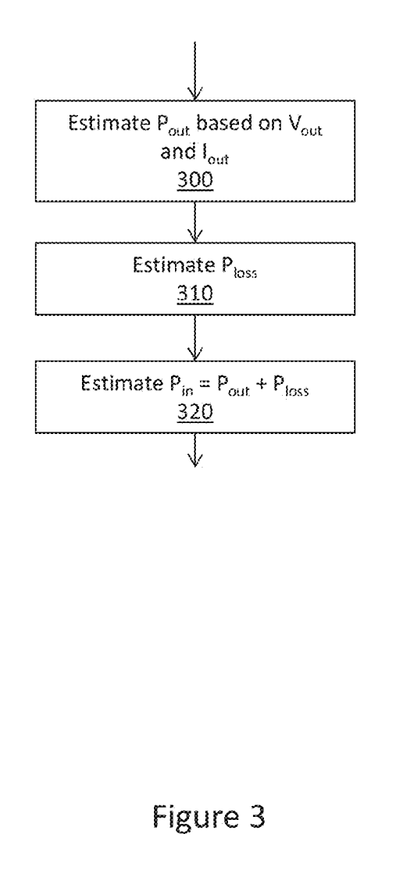
FIG. 3 is a flow diagram of an embodiment of a method of estimating input power of a switching voltage regulator.

The controller 106 also includes an input power estimator 120 for estimating the input power of the switching voltage regulator 100 without having to measure the regulator input current. FIG. 3 illustrates a corresponding flow diagram of the operation of the input power estimator 120 during use. The input power estimator 120 generates an input power estimate ($P_{in}$) of the switching voltage regulator 100 as a function of the output power ($P_{out}$) of the voltage regulator 100, the output current ($I_{out}$) of the voltage regulator 100 and the control effort of the voltage regulator. According to the embodiment illustrated in FIG. 3, the input power estimation technique comprises estimating the output power ($P_{out}$) of the voltage regulator 100 based on the output voltage ($V_{out}$) and the output current ($I_{out}$) of the voltage regulator 100 (Block 300), estimating the power loss ($P_{loss}$) of the voltage regulator 100 (Block 310), and estimating the regulator input power $P_{in}$ based on the estimated output power and the estimated power loss (Block 320).

The output voltage $V_{out}$ of the voltage regulator 100 can be measured with output voltage ADC sense circuitry 122 of the controller 106. The output current $I_{out}$ of the voltage regulator 100 can be measured with the current ADC sense circuitry 114. The measured output current $I_{out}$ represents a summation of the current output by each active phase 104 of the switching voltage regulator 100. The input power estimator 120 can then calculate the power loss ($P_{loss}$) of the voltage regulator 100 based on the measured output voltage and measured output current. In another embodiment, the output voltage ($V_{out}$) of the voltage regulator 100 is measured with the output voltage ADC sense circuitry 122, the output current ($I_{out}$) of the voltage regulator 100 is measured with the current ADC sense circuitry 114, and the input voltage ($V_{in}$) to the power stage 102 is measured with the input voltage ADC sense circuitry 112.

The controller 106 also measures a controller parameter which is indicative of a control signal generated by the controller 106. The control signal is provided to the power stage 102 for controlling operation of the power stage 102. The input power estimator 120 then calculates the power loss ($P_{loss}$) of the voltage regulator 100 based on the measured output voltage, output current, input voltage, and controller parameter. For example, the controller parameter can be measured by sampling or averaging the PWM duty cycle of the controller 106. In another embodiment, the controller parameter can be measured by sampling or averaging the output of the loop compensation filter 118. In each case, the input power of the switching voltage regulator 100 is estimated without having to measure the regulator input current.

Figure 4:
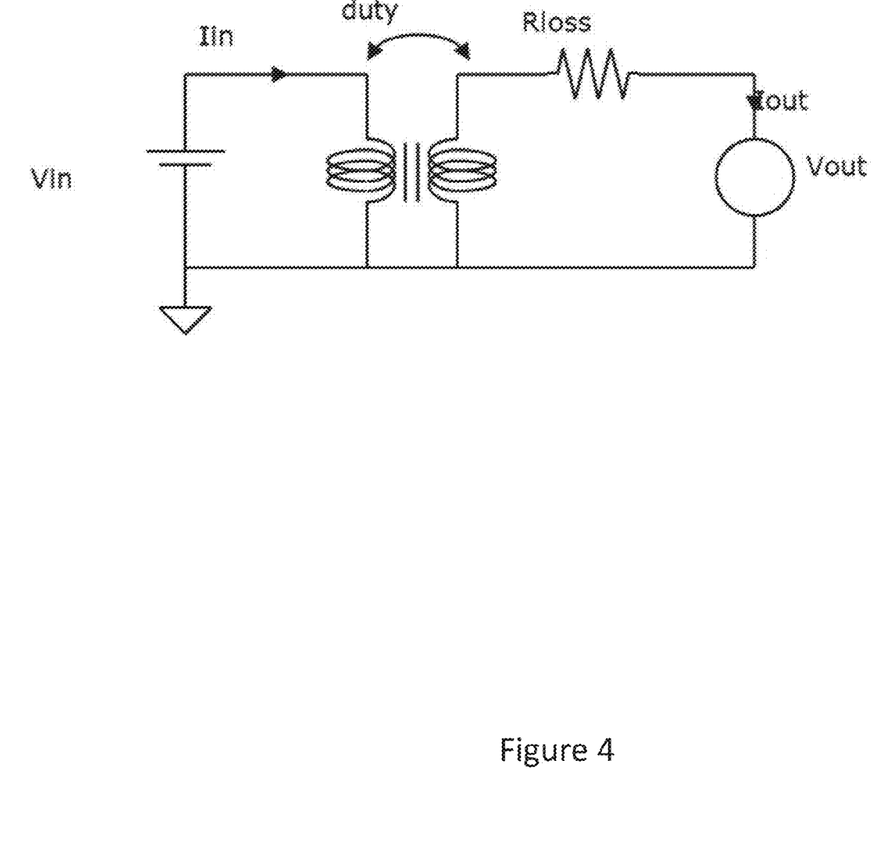
FIG. 4 is a schematic diagram illustrating a first order loss model for a switching voltage regulator.

FIG. 4 illustrates a simplified first order loss model for the switching voltage regulator 100. The total loss of the switching voltage regulator 100 is represented by a resistance $R_{loss}$ which includes several variables such as the gate voltage applied to the transistor gates of the power stage 102, the switching frequency of the power stage transistors, the type of power stage drivers 110, the on-time of the power stage transistors, the dead time between switching a high-side transistor of the power stage 102 off and switching the corresponding low-side transistor on and vice-versa, etc. The average voltage at the inductor input terminal required to maintain the output voltage Vout in light of losses is given by:

$$\text{duty} \cdot V_{in} = V_{out} + I_{out} \cdot R_{loss} \quad (1)$$

where $V_{in}$ is the measured regulator input voltage, $I_{in}$ is the regulator input current, 'duty' is the duty cycle of the power stage, duty·$V_{in}$ corresponds to the input power, $V_{out}$ is the measured regulator output voltage, and $I_{out}$ is the measured total regulator output current. Equation (1) can be expressed as:

$$I_{in} \cdot V_{in} = I_{out} \cdot V_{out} + I_{out}^2 \cdot R_{loss} \quad (2)$$

Substituting $I_{in} = I_{out} \cdot \text{duty}$ into equation (2) yields the following first-order model for the regulator input power:

$$P_{in} = P_{out} + I_{out} \cdot V_{in}(\text{duty} - V_{out}/V_{in}) \quad (3)$$

where $$I_{out} \cdot V_{in}\left(d - \frac{V_{out}}{V_{in}}\right)$$

is a term which represents the power loss of the switching voltage regulator 100.

The input power expression given by equation (3) is based on a single loss term $R_{loss}$ which in lumps together linear and non-linear variables. This simple first-order model can be expressed in different ways as described in more detail below to yield a more accurate estimation of the regulator input power.

In one embodiment, the input power estimator 120 provides an estimate of the regulator input power ($P_{in}$) as given by:

$$P_{in} = \alpha_1 \cdot P_{out} + \alpha_2 \cdot I_{out} \cdot V_{in}\left(\text{duty} - \frac{V_{out}}{V_{in}}\right) + \Delta \quad (4)$$

where $I_{out}$ is the output current of the voltage regulator 100 measured with the current ADC sense circuitry 114 and represents a summation of the current output by each active phase 104 of the switching voltage regulator 100, $V_{out}$ is the output voltage of the voltage regulator 100 measured with the output voltage ADC sense circuitry 122, $V_{in}$ is the input voltage of the voltage regulator 100 measured with the input voltage ADC sense circuitry 112, and 'duty' is the duty cycle of the voltage regulator 100 as determined by the controller 106. Also, $\alpha_1$ is a scaling (gain) factor applied to the voltage regulator output power estimate $P_{out}$, $\alpha_2$ is a scaling (gain) factor applied to the voltage regulator power loss term $P_{loss}$ which is represented by $$I_{out} \cdot V_{in}\left(\text{duty} - \frac{V_{out}}{V_{in}}\right)$$

in equation (4), and $\Delta$ is a power offset term.

As such, the input power $P_{in}$ of the voltage regulator 100 can be estimated by adding a scaled estimate of the regulator output power, a scaled estimate of the regulator power loss and a power offset. For example in equation (4), the estimated output power $P_{out}$ of the voltage regulator 100 is multiplied by a first scale factor α1 to yield the scaled estimate of the output power. The estimated power loss $P_{loss}$ of the voltage regulator 100 is scaled by a second scale factor $\alpha_2$ to yield the scaled estimate of the power loss. The scaling factors $\alpha_1$ and $\alpha_2$ and the power offset $\Delta$ at least partly account for the linear and non-linear variables lumped into the simplified $R_{loss}$ term illustrated in FIG. 4. The scaling factors $\alpha_1$ and $\alpha_2$ and the power offset $\Delta$ can be stored in data registers 124 which are accessible by the regulator controller 106.

The model complexity can increase with minimal increase of computational complexity. For example, the second scaling factor $\alpha_2$ can be approximated as a linear function of the output current $I_{out}$ by simplifying reliance on the regulator duty cycle. Also, terms that include $V_{out}$/duty can be replaced by the input voltage $V_{in}$ measurement to further reduce computational complexity.

In another embodiment, equation (4) is further manipulated to reduce the influence of the input voltage measurement $V_{in}$ on the input power estimate as given by:

$$P_{in} = \alpha_1 \cdot P_{out} + \alpha_2 \cdot P_{out}\left(1 - \frac{V_{out}/V_{in}}{\text{duty}}\right) + \Delta \quad (5)$$

According to this model of the voltage regulator input power, the influence of the input voltage measurement $V_{in}$ on the input power estimate is reduced for the regulator power loss term $$P_{out}\left(1 - \frac{V_{out}/V_{in}}{\text{duty}}\right).$$

If there is zero error in all measurements, then the input power estimate given by equation (4) equals the input power estimate given by equation (5). In one embodiment, the first scale factor $\alpha 1$ is 1 and the second scale factor $\alpha 2$ is 1. The power offset $\Delta$ can be 0 or non-zero. The first and second scale factors $\alpha 1$, $\alpha 2$ can be programmable, as can be the power offset $\Delta$.

Figure 5:
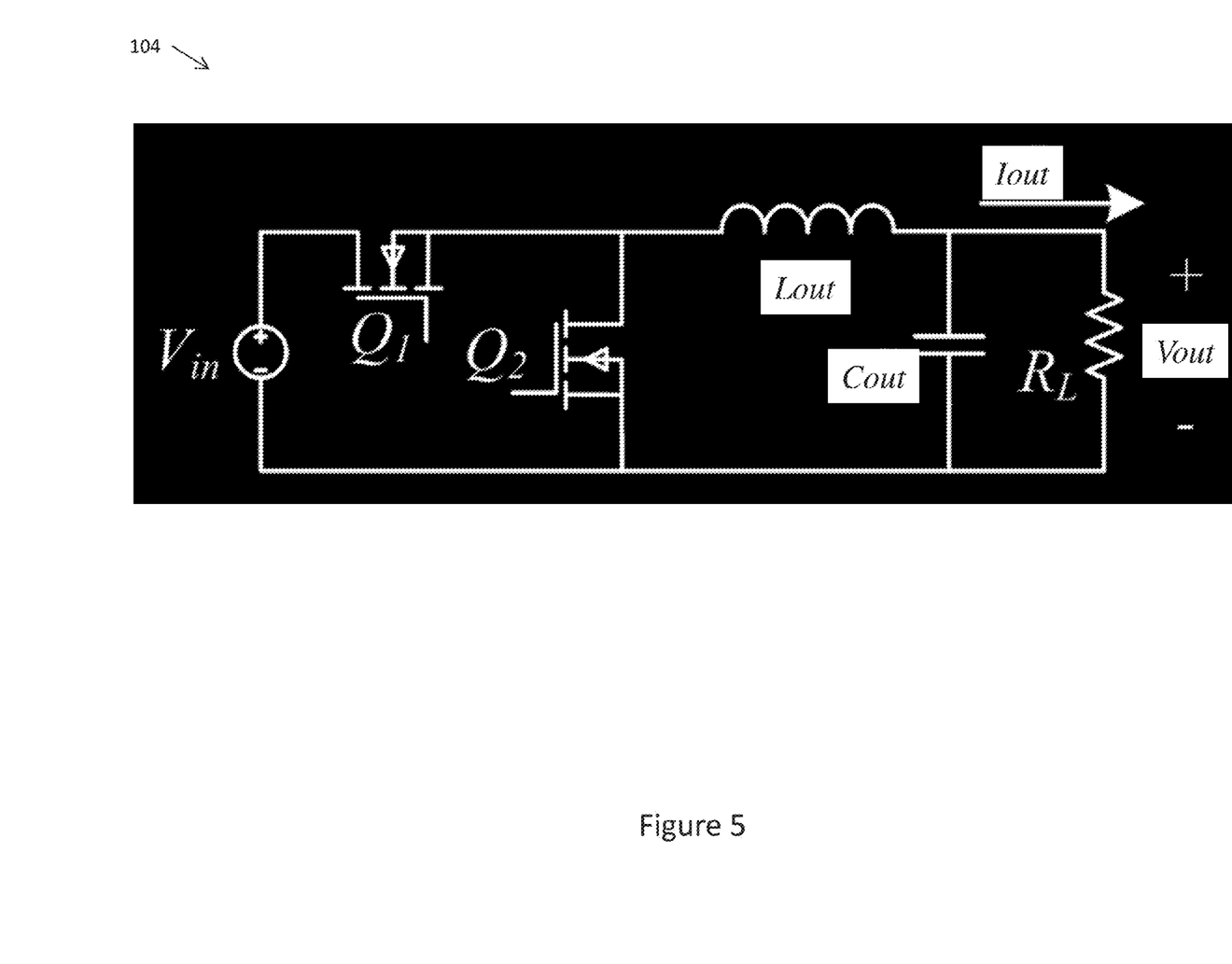
FIG. 5 is a schematic diagram illustrating one phase of a multiphase switching voltage regulator in CCM (continuous conduction mode).

Equation (6) below is an expression for the voltage regulator input power during CCM. When the switching voltage regulator 100 operates in CCM, the inductor current may cross zero, but does not stay at zero between switching cycles. FIG. 5 illustrates a simplified representation of one phase of the switching voltage regulator in CCM, where $V_{in}$ is the input voltage, $V_{out}$ is the output voltage, $I_{out}$ is the output current, $L_{out}$ is the output inductor, $C_{out}$ is the output capacitor, $R_L$ represents the load, Q1 is the high-side transistor and Q2 is the low-side transistor. The input power estimator 120 provides an estimate of the voltage regulator input power ($P_{in}$) in CCM as given by:

$$P_{in} = P_{out} + P_{loss}$$

$$P_{in} = P_{out} + P_{HS(Q1)} + P_{LS(Q2)} + P_{Lo} + P_{Co}$$

$$P_{HS(Q1)} = P_{switch,on} + P_{switch,off} + P_{conduction} + P_{gate} + P_{Coss}$$

$$P_{LS(Q2)} = P_{diode} + P_{conduction} + P_{gate}$$

$$P_{Lo} = L_{conduction} + P_{core}$$

$$P_{in} = \alpha_1 P_{out} + I_{out}\alpha_2 V_{eq}(\text{duty}, I_{out}) + N_{ph}\Delta \quad (6)$$

where $P_{HS(Q1)}$ is the power loss component for the high-side transistor Q1, $P_{LS(Q2)}$ is the power loss component for the low-side transistor Q2, $P_{Lo}$ is the power loss component for the output inductor $L_{out}$, $P_{Co}$ is the power loss component for the output capacitor $C_{out}$, $P_{switch,on}$ is the power loss component for transistor Q1 while transitioning from the off-state to the on-state, $P_{switch,off}$ is the power loss component for transistor Q1 transitioning from the on-state to the off-state, $P_{conduction}$ is a conduction power loss component, $P_{gate}$ is a gate (input) capacitance power loss component for each transistor Q1/Q2, $P_{Coss}$ is an output capacitance power loss component, and $P_{diode}$ is a diode power loss component. The expression $I_{out}\alpha_2 V_{eq}(\text{duty}, I_{out})$ in equation (6) represents the power loss term for the switching voltage regulator 100.

The variable $N_{ph}$ corresponds to the number of phases 104 included in the power stage 102. As such, the power offset $\Delta$ can be scaled based on the number of active phases 104. Alternatively, a different value is used for the power offset $\Delta$ for each combination of active phases 104 ($N_{ph}=1$, $N_{ph}=2$, etc.). The power offset $\Delta$ also can be updated when the load 107 regulated by the voltage regulator 100 changes.

In one embodiment, the expression $V_{eq}(\text{duty}, I_{out})$ in equation (6) is expressed as given by:

$$V_{eq}(\text{duty}, I_{out}) = \quad (7)$$
$$2V_F t_d F_{sw} + \frac{I_{out}}{N_{ph}}[\text{duty} \cdot R_{ds,HS} + (1-\text{duty})R_{ds,LS} + DCR] + \frac{V_{out}}{\text{duty}}t_{sw}F_{sw}$$

where $V_{eq}(\text{duty}, I_{out})$ is an equivalent voltage term, $2V_F t_d F_{sw}$ is a diode loss term, $$\frac{V_{out}}{\text{duty}}t_{sw}F_{sw}$$

is a DC conduction loss term, $$\frac{I_{out}}{N_{ph}}[\text{duty} \cdot R_{ds,HS} + (1-\text{duty})R_{ds,LS} + DCR]$$

is a switching loss term, $V_f$ is diode forward voltage, $t_d$ is the dead-time between the high-side and low-side transistors Q1/Q2, $F_{SW}$ is the switching frequency of the power stage transistors Q1/Q2 in CCM, $R_{ds,HS}$ is the on-state resistance of the high-side transistor Q1, $R_{ds,LS}$ is the on-state resistance of the low-side transistor Q2, DCR is the non-ideal DC resistance of the output inductor $L_{out}$, and $t_{SW}$ is the time to switch the high-side transistor Q1 on or off (not the inverse of switching frequency).

In general, the power offset term $\Delta$ can be a per-phase quantity. The regulator controller 106 is aware of its phase count and can adjust $\Delta$ accordingly as explained above. The power offset term $\Delta$ can be different for CCM and PFM (pulse frequency modulation) mode which is also known as DCM. The controller 106 is aware of the operating state and can adjust $\Delta$ accordingly. The first and second scale (gain) factors $\alpha_1$ and $\alpha_2$ also have phase count and operating mode dependencies. The controller 106 can adjust $\alpha_1$ and/or $\alpha_2$ based on phase count and CCM/PFM (DCM) mode. In PFM (DCM), on-time reduction can result in further adjustments to $\alpha_1$, $\alpha_2$ and/or $\Delta$. For example, on-time reductions from 100% to e.g. 75% to e.g. 50% can result in three separate $\alpha_1$, $\alpha_2$ and $\Delta$ values. These values can be stored in the data registers 124 accessible by the controller 106.

In one embodiment for CCM, the power offset term $\Delta$ is expressed as given by:

$$\Delta = V_{gs}F_{sw}(Q_{g,HS} + Q_{g,LS}) + k\Delta I_L^x F_{sw}^y + \quad (8)$$
$$\Delta I_L^2\left[\frac{1}{12}\left(\frac{V_{out}}{V_{in}}R_{ds,HS} + \left(1 - \frac{V_{out}}{V_{in}}\right)R_{ds,LS}\right) + \frac{1}{3}DCR\right] + \frac{1}{2}C_{oss}V_{in}^2$$

where $V_{gs}F_{sw}(Q_{g,HS}+Q_{g,LS})$ represents gate conduction loss of the high-side and low-side transistors, $k\Delta I_L^x F_{sw}^y$ represents core loss, $$\Delta I_L^2 \left[ \frac{1}{12} \left( \frac{V_{out}}{V_{in}} R_{ds,HS} + \left(1 - \frac{V_{out}}{V_{in}}\right) R_{ds,LS} \right) + \frac{1}{3} DCR \right]$$

represents AC conduction loss, and $$\frac{1}{2} C_{oss} V$$

represents output capacitance loss. Also, $R_{ds,HS}$ is the drain-to-source resistance of the high-side transistor Q1, $R_{ds,LS}$ is the drain-to-source resistance of the low-side transistor Q2, $Q_{g,HS}$ is the gate charge of the high-side transistor Q1, $Q_{g,LS}$ is the gate charge of the low-side transistor Q2, k is a constant term for the inductor magnetic material, and $C_{oss}$ is the output capacitance of the high-side transistor Q1.

Equation (9) below is an expression for the voltage regulator input power during DCM (PFM) of operation. When the switching voltage regulator 100 operates in DCM (PFM), the inductor current of the voltage regulator 100 reaches zero between switching cycles. The input power estimator 120 provides an estimate of the voltage regulator input power $P_{in}$ in DCM (PFM) as given by:

$$P_{in} = P_{out} + P_{loss}$$

$$P_{in} = P_{out} + P_{HS(Q1)} + P_{LS(Q2)} + P_{Lo} + P_{Co}$$

$$P_{HS(Q1)} = P_{switch,off} + P_{conduction} + P_{gate}$$

$$P_{LS(Q2)} = P_{diode} + P_{conduction} + P_{gate}$$

$$P_{in} = P_{out} + \alpha_{PFM} I_{out} V_{eq,PFM}(F_{PFM}, I_{out}) + \Delta_{PFM} \quad (9)$$

where $\Delta_{PFM} I_{out} V_{eq,PFM}(F_{PFM}, I_{out})$ relates the regulator duty cycle to input power and $\Delta_{PFM}$ is a frequency/inductor ripple loss offset term.

In one embodiment, the expression $V_{eq,PFM}(F_{PFM}, I_{out})$ in equation (9) is expressed as given by:

$$V_{eq,PFM}(F_{PFM}, I_{out}) = \frac{2V_{out}}{T_{on} V_{in}} V_F I_d + \frac{4 I_{out} V_{out}^2}{3 F_{PFM} T_{on} V_{in}^2} \left[ R_{ds,HS} + \left( \frac{V_{in}}{V_{out}} - 1 \right) R_{ds,LS} + \frac{V_{in}}{V_{out}} DCR \right] + V_{out} \frac{t_{sw}}{T_{on}} \quad (10)$$

where $$\frac{4 I_{out} V_{out}^2}{3 F_{PFM} T_{on} V_{in}^2} \left[ R_{ds,HS} + \left( \frac{V_{in}}{V_{out}} - 1 \right) R_{ds,LS} + \frac{V_{in}}{V_{out}} DCR \right]$$

represents diode loss, $$\frac{2V_{out}}{T_{on} V_{in}} V_F I_d$$

represents conduction loss, $$V_{out} \frac{t_{sw}}{T_{on}}$$

represents switching loss, and $F_{PFM}$ is the switching frequency in PFM (DCM).

In one embodiment for DCM (PFM), the power offset term $\Delta_{PFM}$ is expressed as given by:

$$\Delta_{PFM} = V_{gs} F_{PFM} (Q_{g,HS} + Q_{g,LS}) + k \Delta I_L^x F_{PFM}^y \quad (11)$$

where $V_{gs} F_{PFM}(Q_{g,HS} + Q_{g,LS})$ represents gate loss and $k \Delta I_L^x F_{PFM}^y$ represents core loss.

In DCM (PFM) mode of operation, $V_{eq}$ and duty cycle are functions of the PFM switching frequency $F_{PFM}$ which in turn is a function of the regulator output current $I_{out}$. For more accurate results, $V_{eq}$ and duty cycle are updated when the load 107 changes. The scaling (gain) factor $\alpha_{PFM}$ can be continually adjusted to further reduce calculation complexity.

In one embodiment, the scaling factors and power offset previously described herein are determined by measuring the input power of the voltage regulator 100 during a verification process. The scaling factors and power offset are adjusted until the output power reported by the voltage regulator 100 during the verification process is within a predetermined tolerance of the measured input power. Alternatively, the scaling factors and power offset can be computed e.g. in accordance with the equations presented herein. In either case, the scaling factors and power offset can be stored in the data registers 124 accessible by the controller 106.

Described next is an embodiment of determining initial values for the scaling factors and power offset. The first order model represented by equations (1) though (3) lumps multi-variable loss elements as resistive losses. Based on this simple model, it is then unclear what initial values for the scaling factors and power offset should be used to tune the input power estimator 120. One starting point is a function of the individual design e.g. the power stage transistors, drivers and inductors used, the switching frequency, the nominal operating voltages, etc. For example, the regulator output power $P_{out}$ can be expressed as given by:

$$P_{out} + \alpha_1 I_{out} V_{in} \left( \text{duty} - \frac{V_{out}}{V_{in}} \right) + \Delta_1 = \quad (12)$$
$$P_{out} + \alpha_3 I_{out} V_{eq}(\text{duty}, I_{out}) + N_{ph} \Delta_3$$

By setting $\alpha 3 = 1$, like terms can be collected as given by:

$$\Delta_1 = N_{ph} \Delta_3 \quad (13)$$

$$\Delta_1 = N_{ph} \left\{ V_{gs} F_{sw}(Q_{g,HS} + Q_{g,LS}) + k \Delta I_L^x F_{sw}^y + \Delta I_L^2 \left[ \frac{1}{12} \left( \frac{V_{out}}{V_{in}} R_{ds,HS} + \left(1 - \frac{V_{out}}{V_{in}}\right) R_{ds,LS} \right) + \frac{1}{3} DCR \right] + \frac{1}{2} C_{oss} V_{in}^2 \right\}$$

The scaling (gain) term a1 can be expressed as given by:

$$\alpha_1 = \frac{V_{eq}(\text{duty}, I_{out})}{V_{in} D_{loss}} \quad (14)$$

$$\alpha_1 = \frac{\eta}{V_{out}(1-\eta)} \left\{ 2 V_F I_d F_{sw} + \right.$$

$$\frac{I_{out}}{N_{ph}}\left[\frac{V_{out}}{V_{in}} \cdot R_{ds,HS} + \left(1 - \frac{V_{out}}{V_{in}}\right)R_{ds,LS} + DCR\right] + V_{in}t_{sw}F_{sw}\right\}$$

where $$\text{duty} = \frac{V_{out}}{V_{in}} + D_{loss},$$

$$D_{loss} = \frac{V_{out}(1-\eta)}{\eta V_{in}},$$

and η is efficiency.

In any switching voltage regulator design, the devices and their parameters are known. Efficiency at some input voltage $V_{in}$, output voltage $V_{out}$ and output current $I_{out}$ is known/simulated/calculated. The scaling factors and power offset can be calculated at the known operating point.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of estimating input power of a voltage regulator, the method comprising:
   estimating output power of the voltage regulator based on output voltage and output current of the voltage regulator;
   estimating power loss of the voltage regulator; and
   estimating input power of the voltage regulator based on the estimated output power and the estimated power loss,
   wherein estimating the power loss of the voltage regulator comprises:
      measuring output voltage of the voltage regulator with voltage sense circuitry;
      measuring output current of the voltage regulator with current sense circuitry;
      measuring input voltage to a power stage of the voltage regulator with voltage sense circuitry;
      measuring a controller parameter indicative of a control signal generated by a controller of the voltage regulator; and
      calculating the power loss of the voltage regulator based on the measured output voltage the measured output current, the measured input voltage and the controller parameter,
   wherein measuring the controller parameter comprises sampling or averaging a PWM (pulse width modulation) duty cycle of the controller.

2. A voltage regulator, comprising:
   a power stage configured to deliver output current to a load through an inductor;
   a controller operable to:
      estimate output power of the voltage regulator based on output voltage and output current of the voltage regulator;
      estimate power loss of the voltage regulator; and
      estimate input power of the voltage regulator based on the estimated output power and the estimated power loss;
   voltage sense circuitry operable to measure the output voltage of the voltage regulator;
   current sense circuitry operable to measure the output current of the voltage regulator; and
   voltage sense circuitry operable to measure an input voltage to the power stage,
   wherein the controller is operable to measure a controller parameter indicative of a control signal generated by the controller,
   wherein the controller is operable to calculate the power loss of the voltage regulator based on the measured output voltage, the measured output current, the measured input voltage, and the controller parameter,
   wherein the controller is operable to measure the controller parameter by sampling or averaging a PWM (pulse width modulation) duty cycle of the controller.

3. A method of estimating input power of a voltage regulator, the method comprising:
   estimating output power of the voltage regulator based on output voltage and output current of the voltage regulator;
   estimating power loss of the voltage regulator; and
   estimating input power of the voltage regulator based on the estimated output power and the estimated power toss,
   wherein estimating the power loss of the voltage regulator comprises calculating the power loss by adding a scaled estimate of the output power, a scaled estimate of the power loss, and an offset,
   wherein the voltage regulator comprises a plurality of phases one or more of which is active during operation of the voltage regulator,
   the method further comprising at least one of:
      scaling the offset based on the number of active phases; and
      using a different value for the offset for each combination of active phases.

4. The method of claim 3, further comprising:
   multiplying the estimated output power by a first scale factor to determine the scaled estimate of the output power; and
   multiplying the estimated power loss by a second scale factor to determine the scaled estimate of the power loss.

5. The method of claim 4, wherein the first scale factor is 1 and the second scale factor is 1.

6. The method of claim 4, wherein the first scale factor is 1, the second scale factor is 1 and the offset is 0.

7. The method of claim 3, wherein the voltage regulator is configured to operate in continuous conduction mode and discontinuous conduction mode, and wherein a different value is used for the offset in the continuous conduction mode than in the discontinuous conduction mode.

8. The method of claim 7, wherein the voltage regulator is configured to implement different on-time periods when in the discontinuous conduction mode, and wherein a different value is used for the offset for each of the on-time periods.

9. A voltage regulator, comprising:
a power stage configured to deliver output current to a load through an inductor; and
a controller operable to:
  estimate output power of the voltage regulator based on output voltage and output current of the voltage regulator;
  estimate power loss of the voltage regulator; and
  estimate input power of the voltage regulator based on the estimated output power and the estimated power loss,
wherein the controller is operable to calculate the input power loss by adding a scaled estimate of the output power, a scaled estimate of the power loss, and an offset,
  wherein the power stage is configured to operate in continuous conduction mode and discontinuous conduction mode, and wherein a different value is used for the offset in the continuous conduction mode than in the discontinuous conduction mode.

10. The voltage regulator of claim 9, wherein the power stage is configured to implement different on-time periods when in the discontinuous conduction mode, and wherein a different value is used for the offset for each of the on-time periods.

11. A voltage regulator, comprising:
a power stage configured to deliver output current to a load through an inductor; and
a controller operable to:
  estimate output power of the voltage regulator based on output voltage and output current of the voltage regulator;
  estimate power loss of the voltage regulator; and
  estimate input power of the voltage regulator based on the estimated output power and the estimated power loss,
wherein the controller is operable to calculate the power loss by adding a scaled estimate of the output power, a scaled estimate of the power loss, and an offset,
wherein the power stage comprises a plurality of phases one or more of which is active during operation of the voltage regulator,
wherein the controller is operable to scale the offset based on the number of active phases and/or use a different value for the offset for each combination of active phases.

* * * * *